US006312992B1

(12) United States Patent
Cho

(10) Patent No.: US 6,312,992 B1
(45) Date of Patent: Nov. 6, 2001

(54) THIN FILM TRANSISTOR AND METHOD FOR FABRICATING THE SAME

(75) Inventor: Seok Won Cho, Chungcheongbuk-do (KR)

(73) Assignee: Hyundai Electronics Industries Co., Ltd., Ichon-shi (KR)

( * ) Notice: Subject to any disclaimer, the term of this patent is extended or adjusted under 35 U.S.C. 154(b) by 0 days.

(21) Appl. No.: 09/158,793

(22) Filed: Sep. 23, 1998

(30) Foreign Application Priority Data

Jan. 10, 1998 (KR) ........................................ 98-453

(51) Int. Cl.[7] ........................ H01L 21/336; H01L 27/108

(52) U.S. Cl. .......................... 438/268; 438/164; 438/212; 438/242; 438/270; 438/412; 257/302; 257/329

(58) Field of Search .................................... 438/163, 149, 438/239, 41, 212, 412, 164, 242, 268, 270; 257/66, 532, 353, 329, 302

(56) References Cited

U.S. PATENT DOCUMENTS 5,578,838 11/1996 Cho et al. .............................. 257/66
5,612,559 * 3/1997 Park et al. .............................. 257/302
5,659,183 8/1997 Manning et al. ........................ 257/66
5,668,391 * 9/1997 Kim et al. ............................. 257/328
5,728,604 * 3/1998 Rha et al. .............................. 438/41
5,780,888 * 7/1998 Maeda et al. .......................... 257/302
5,801,397 * 9/1998 Cunningham ........................... 257/66
5,937,283 * 8/1999 Lee ...................................... 438/149
5,998,839 * 12/1999 Cho ...................................... 257/347
6,018,176 * 1/2000 Lim ...................................... 257/302
6,114,725 * 9/2000 Furukawa et al. ...................... 257/330

* cited by examiner

*Primary Examiner*—Eddie Lee
*Assistant Examiner*—José R. Diaz
(74) *Attorney, Agent, or Firm*—Fleshner & Kim, LLP

(57) ABSTRACT

Thin film transistor and method for fabricating the same, is disclosed, in which a channel width of the thin film transistor is made greater in a narrow area for improving an on/off performance of the thin film transistor, the thin film transistor including a source electrode formed on a substrate, a columnar conductive layer connected to the source electrode, a drain electrode formed on the conductive layer, a gate insulating film formed to cover the conductive layer and the drain electrode, a gate electrode formed on the gate insulating film surrounding the conductive layer, and an insulting film formed between the source electrode and the gate electrode.

15 Claims, 7 Drawing Sheets

THIN FILM TRANSISTOR AND METHOD FOR FABRICATING THE SAME

BACKGROUND OF THE INVENTION

1. Field of the Invention

The present invention relates to a semiconductor device, and more particularly, to a thin film transistor and a method for fabricating the same, in which a channel width of the thin film transistor is made greater in a narrow area for improving an on/off performance of the thin film transistor.

2. Background of the Related Art

In general, the thin film transistor is used in place of a CMOS load transistor or a load resistor in an SRAM of 4M or 16M class or over, and also as a switching device for switching a video data signal from each pixel region in a liquid crystal display. Especially, as a PMOS thin film transistor(TFT) is used as a load transistor in the SRAM cell, an off-current in the load transistor can be reduced and an on-current in the load transistor can be increased, to reduce a power consumption in the SRAM cell and to improve a memory characteristic, allowing to obtain a high quality SRAM cell.

A background art thin film transistor and a method for fabricating the same will be explained with reference to the attached drawings. FIG. 1 illustrates a section of the background art thin film transistor.

Referring to FIG. 1, the background art thin film transistor is provided with an insulating layer 21, a gate electrode 22*a* on the insulating layer 21, a gate insulating film 24 formed on the insulating layer 21 inclusive of the gate electrode 22*a*, a drain electrode D formed on the gate insulating film 24 spaced apart from the gate electrode 22*a*, a source electrode S formed on the gate insulating film 24 opposite to the drain electrode D overlapped with the gate electrode 22*a*, and a channel region I and an offset region II formed on the gate insulating film 24 between the source electrode S and the drain electrode D. The offset region II is a region between the drain electrode D and the gate electrode 22*a*.

A background art method for fabricating a thin film transistor will be explained. FIGS. 2A~2D illustrates sections showing the process steps of the background art method for fabricating a thin film transistor.

Referring to FIG. 2A, a first polysilicon layer 22 to be used as a gate electrode of a bulk transistor is formed on an insulating layer 21. Photoresist is coated on the first polysilicon layer 22 and exposed and developed to form a mask pattern 23. The first polysilicon layer 22 is selectively etched using the mask pattern 23, to form a gate electrode 22*a* as shown in FIG. 2B. Then, as shown in FIG. 2C, a gate insulating film 24 is deposited on the insulating layer 21 inclusive of the gate electrode 22*a*. A second polysilicon layer 25 to be used as source and drain electrodes, an offset region and a channel region is formed on the gate insulating film 24. A photoresist 26 is coated on the second polysilicon layer 25 and patterned by exposure and development. As shown in FIG. 2D, the patterned photoresist 26*a* defines the channel region and the offset region. Then, impurity ions are injected into the exposed second polysilicon layer 25 using the patterned photoresist 26*a* as a mask, to form source/drain. Accordingly, the source electrode S is formed overlapped with a portion of the gate electrode 22*a*, and the drain electrode D is formed spaced from the gate electrode 22*a*. And, the channel region I and the offset region II are formed between the source electrode S and the drain electrode D.

However, the background art thin film transistor and the method for fabricating the same has a problem in that it has a lower on-current because the offset region is not influenced from a gate voltage.

SUMMARY OF THE INVENTION

Accordingly, the present invention is directed to a thin film transistor and a method for fabricating the same that substantially obviates one or more of the problems due to limitations and disadvantages of the related art.

An object of the present invention is to provide a thin film transistor and a method for fabricating the same which has an increased on-current and a wider channel in a small area.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the thin film transistor including a source electrode formed on a substrate, a columnar conductive layer connected to the source electrode, a drain electrode formed on the conductive layer, a gate insulating film formed to cover the conductive layer and the drain electrode, a gate electrode formed on the gate insulating film surrounding the conductive layer, and an insulting film formed between the source electrode and the gate electrode.

In other aspect of the present invention, there is provided a method for fabricating a thin film transistor, including the steps of (1) forming a source electrode on a substrate, (2) forming a columnar conductive layer connected to the source electrode, (3) forming an insulating film to a height on the substrate inclusive of the source electrode, (4) injecting ions to form a drain electrode in an upper part of the conductive layer, (5) forming a gate insulating film on the insulating film to cover the conductive layer and the drain electrode, and (6) forming a gate electrode on the gate insulating film covering the conductive layer.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENT

Figure 1:
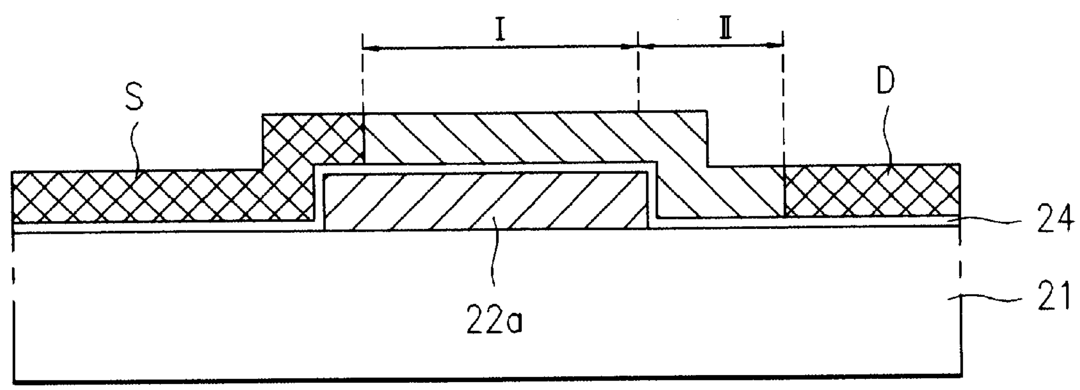
FIG. 1 illustrates a section of a background art thin film transistor.
Figure 2A:
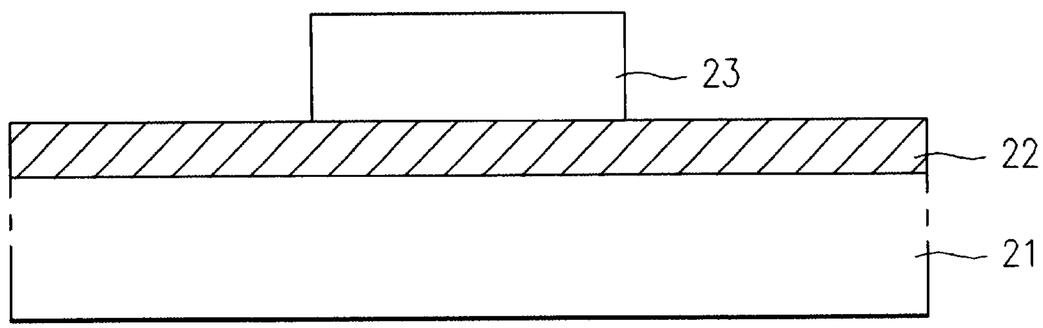
FIGS. 2A~2D illustrate sections showing the process steps of a background art method for fabricating a thin film transistor.
Figure 2B:
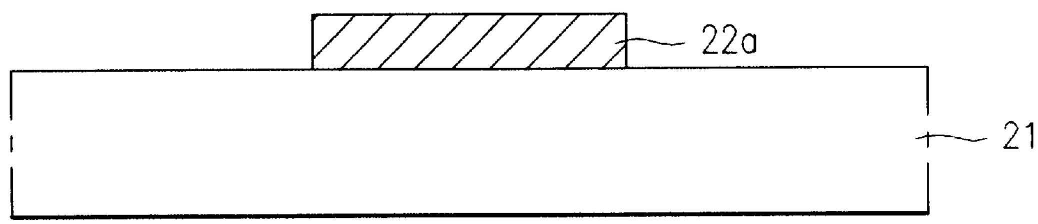
Figure 2C:
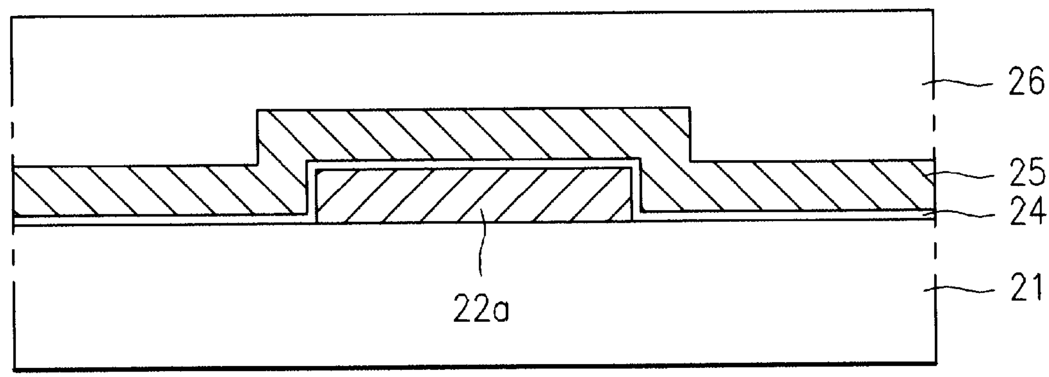
Figure 2D:
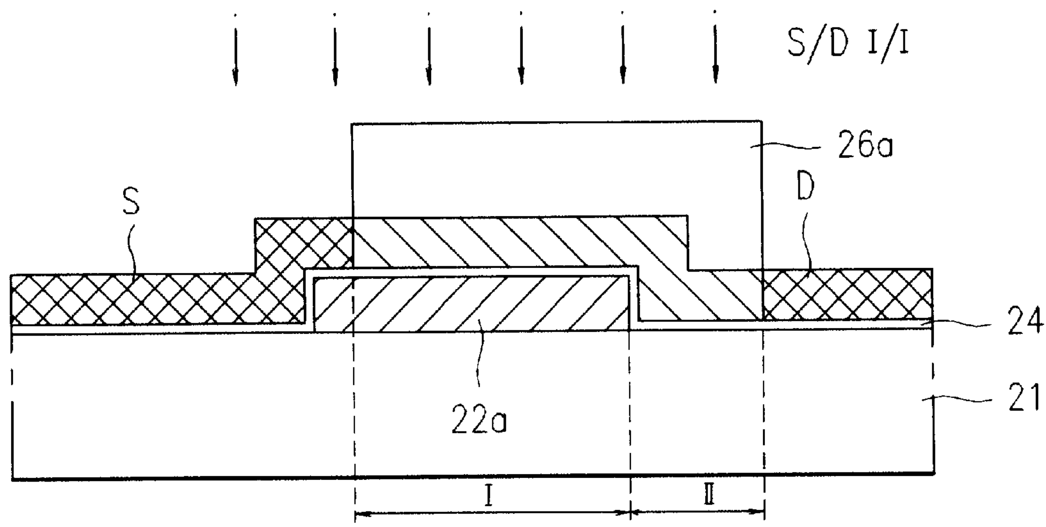
Figure 3A:
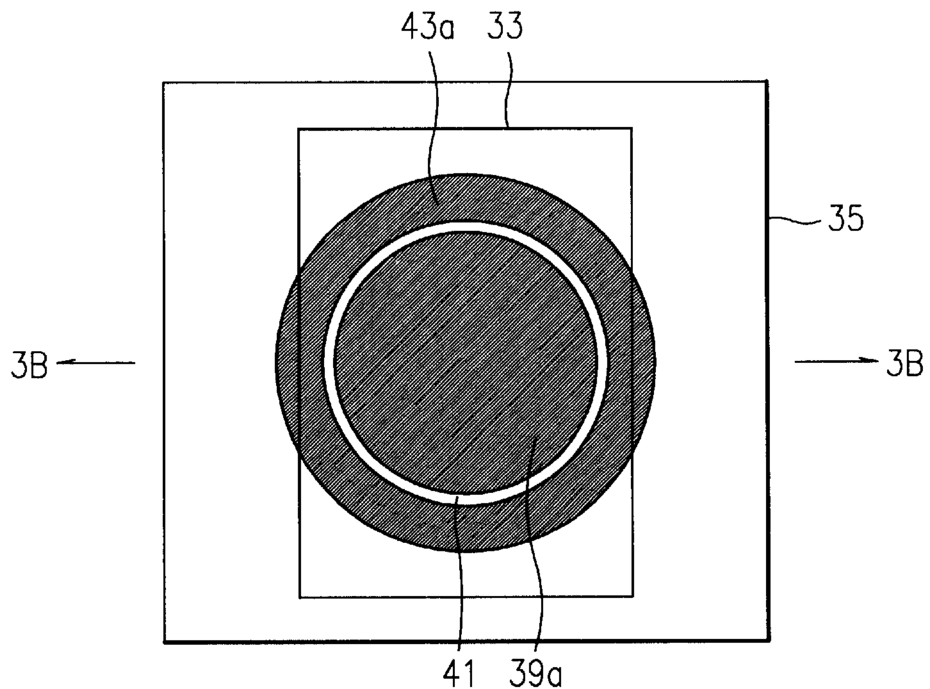
FIG. 3A illustrates a lay-out of a thin film transistor in accordance with a preferred embodiment of the present invention.

Reference will now be made in detail to the preferred embodiments of the present invention, examples of which are illustrated in the accompanying drawings. FIG. 3A illustrates a lay-out of a thin film transistor in accordance with a preferred embodiment of the present invention, and FIG. 3B illustrates a perspective view of a section across line I–I' in FIG. 3A.

Figure 3B:
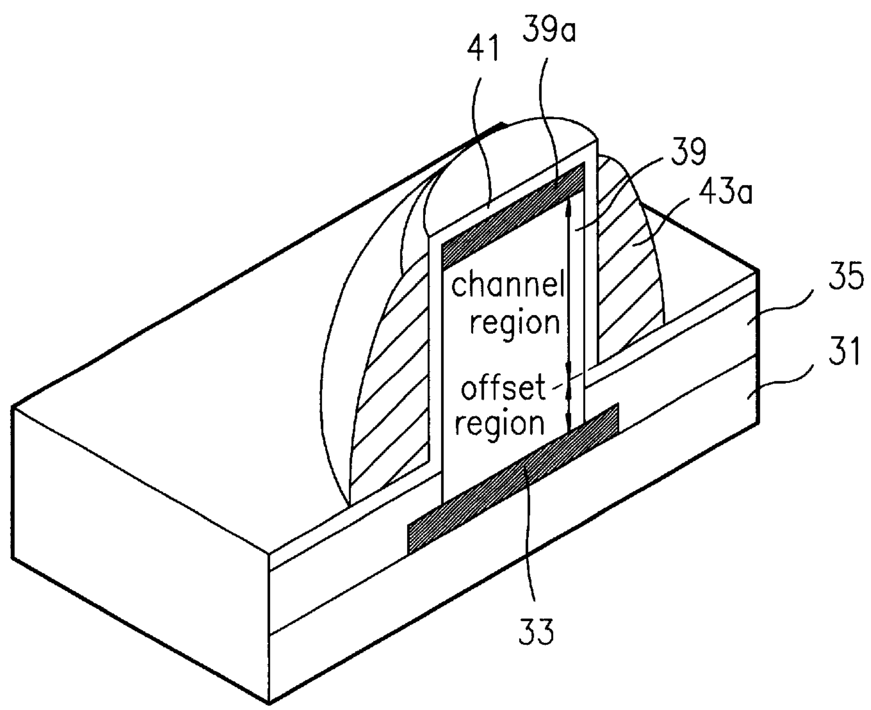
FIG. 3B illustrates a perspective view of a section across line 3*b*–3*b* in FIG. 3A; and, FIGS. 4A~4H illustrate sections showing the process steps of a method for fabricating a thin film transistor in accordance with a preferred embodiment of the present invention.

Referring to FIG. 3B, the thin film transistor in accordance with a preferred embodiment of the present invention includes a substrate 31, a source electrode 33 formed on the substrate 31, a conductive layer 39 formed on the source electrode 33, an upper portion of which conductive layer 39 serves as a drain electrode 39*a*, a gate insulating layer 41 formed on the drain electrode 39 and the conductive layer 39, and a gate electrode 43*a* formed on the gate insulating film 41 spaced from the source electrode 33 and enclosing the conductive layer 39 and the drain electrode 39*a*. The conductive layer 39 has a form of cylindrical column, and there is an insulating film 35 between the source electrode 33 and the gate electrode 43*a*. And, an offset region is formed in a portion of the conductive layer 39 corresponding to positions between a bottom of the gate electrode 43*a* to a top of the source electrode 33. The channel region is formed in the conductive layer 39 corresponding to a height of the gate electrode 43*a*. Both the offset region and the channel region are formed vertical to the substrate 31.

A method for fabricating a thin film transistor in accordance with a preferred embodiment of the present invention will be explained. FIGS. 4A~4H illustrate sections showing the process steps of a method for fabricating a thin film transistor in accordance with a preferred embodiment of the present invention.

Figure 4A:
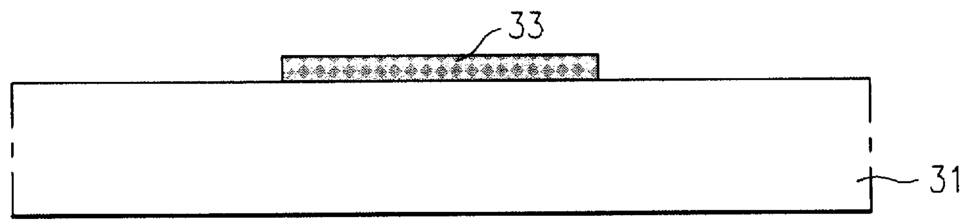
Figure 4B:
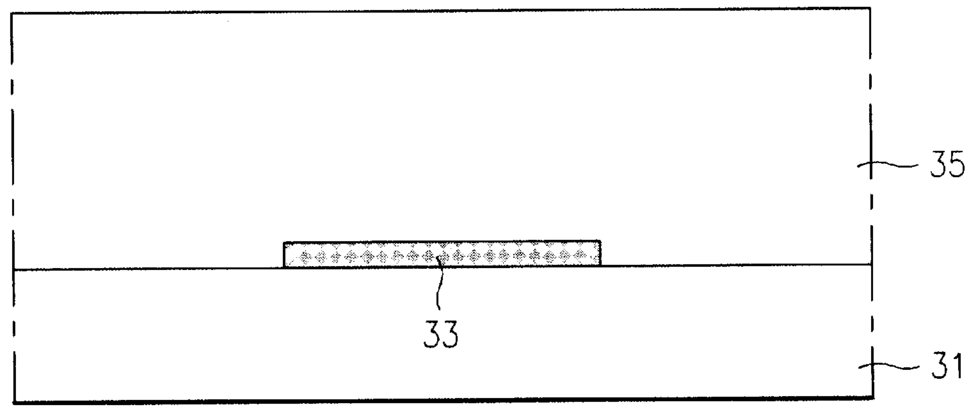
Figure 4C:
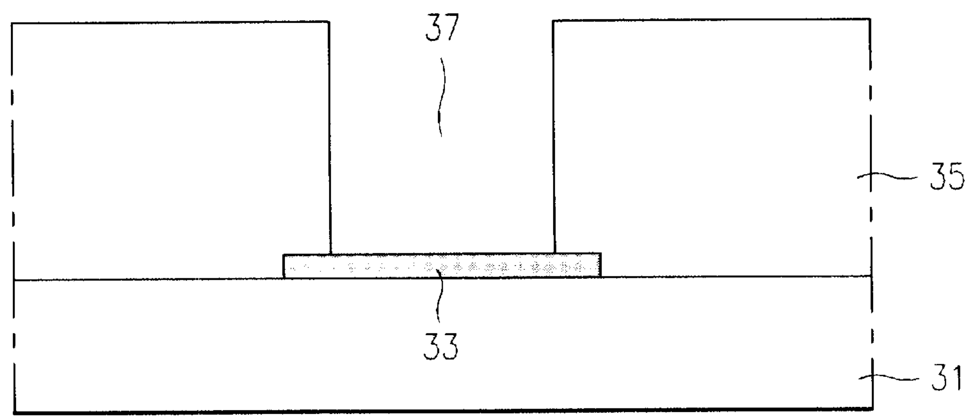
Figure 4D:
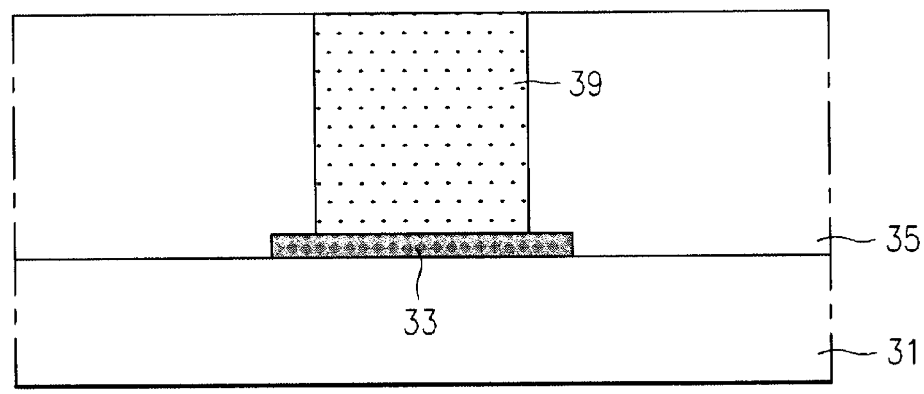
Figure 4E:
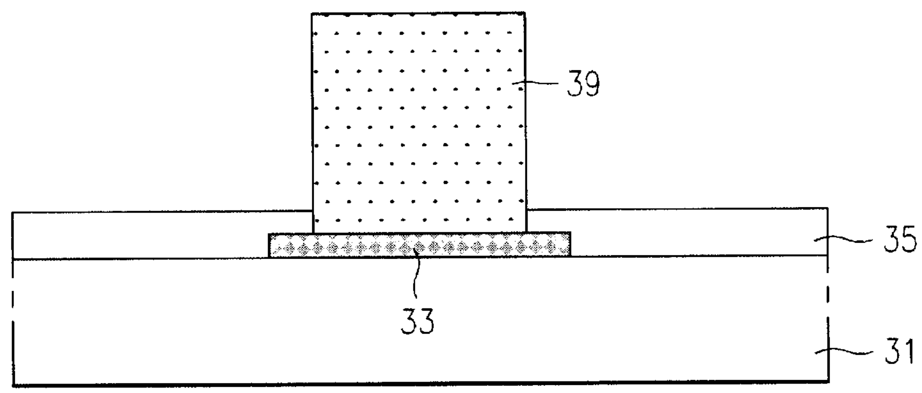
Figure 4F:
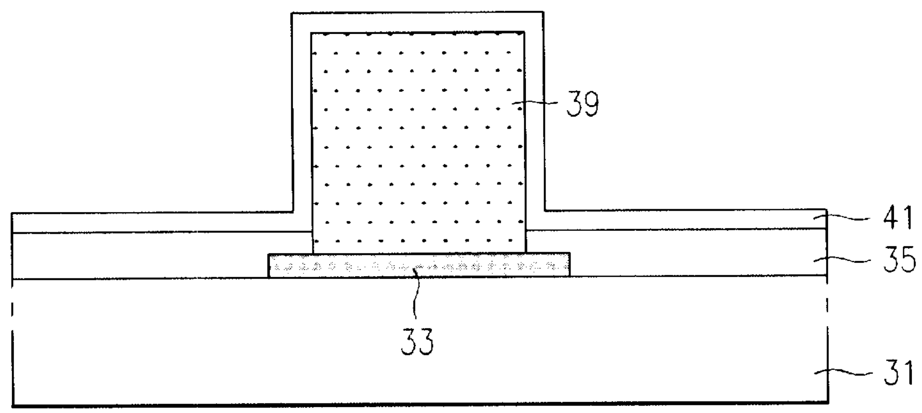
Figure 4G:
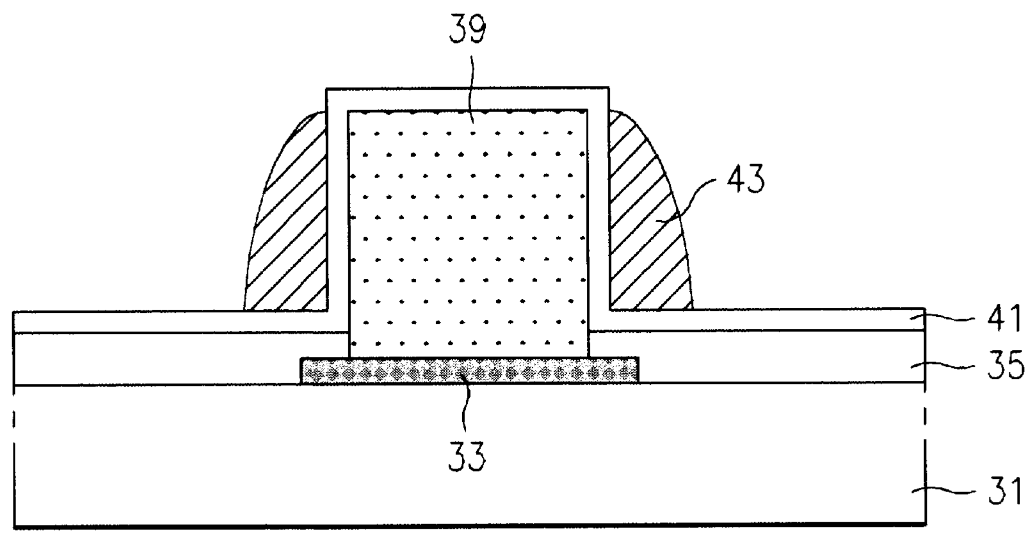
Figure 4H:
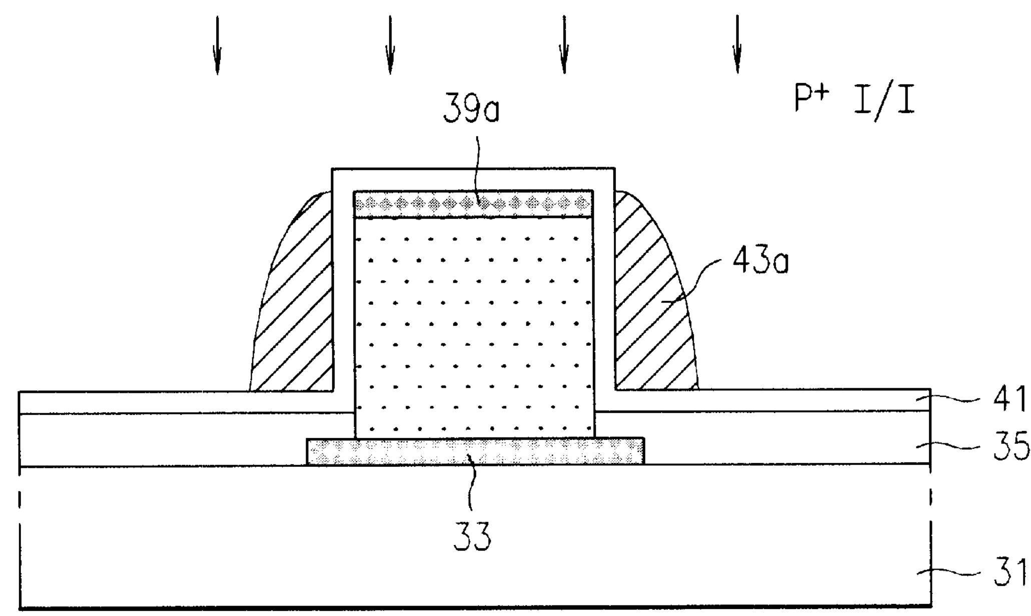

Referring to FIG. 4A, a $P^+$doped polysilicon layer is deposited on an insulating substrate 31 and subjected to patterning by photolithography, to form a source electrode 33. As shown in FIG. 4B, an insulating film 35 is formed on an entire surface of the substrate 31 inclusive of the source electrode 33. In this instance, the steps shown in FIGS. 4A and 4B may be replaced with steps of forming a trench in an insulating layer(a combination of the insulting substrate and the insulating film) and forming the source electrode on a bottom of the trench and stuffing the trench with an insulating material. As shown in FIG. 4C, photoresist(not shown) is coated on the insulating film 35 and subjected to patterning by exposure and development. The insulating film 35 is etched until a surface of the source electrode 33 is exposed, to form a contact hole 37. As shown in FIG. 4D, the contact hole 37 is stuffed with an undoped polysilicon layer, to form a conductive layer 39 of a cylindrical column, which will be used as a channel region and an offset region. As shown in FIG. 4E, the insulating film 35 is etched to a certain extent without using any mask, leaving the insulating film 35 enough to cover the source electrode 33. As shown in FIG. 4F, a gate insulating film 41 is formed to cover the conductive layer 39 inclusive of the insulating film 35. As shown in FIG. 4G, a polysilicon layer is formed to surround the gate insulating film 41 and etched back, to form a polysilicon pattern 43 surrounding the conductive layer 39 with the gate insulating film 41 inbetween. As shown in FIG. 4H, $P^{30}$ ions are injected into an entire surface inclusive of the polysilicon pattern 43, to make upper portions of the polysilicon pattern 43 and the conductive layer 39 conductive. Accordingly, the polysilicon pattern 43 may be used as a gate electrode 43*a* of a thin film transistor, and the upper portion of the conductive layer 39 may be used as a drain electrode 39*a* of the thin film transistor.

The thin film transistor and the method for fabricating the same of the present invention has the following advantages.

First, the wider channel compared to area allowed by the use of a surface of a cylindrical column as a region of the channel of a thin film transistor allows an increased on-current.

Second, the formation of an offset region without using a mask allows a stable thin film transistor.

It will be apparent to those skilled in the art that various modifications and variations can be made in the thin film transistor and the method for fabricating the same of the present invention without departing from the spirit or scope of the invention. Thus, it is intended that the present invention cover the modifications and variations of this invention provided they come within the scope of the appended claims and their equivalents.

What is claimed is:

1. A method for fabricating a thin film transistor, comprising:

forming a source electrode on a substrate;

forming a columnar conductive layer connected to the source electrode;

forming an insulating film on the substrate inclusive of the source electrode, wherein the thickness of the insulating film above the source electrode is adjusted for fixing a height of an offset region;

injecting ions to form a drain electrode in an upper part of the columnar conductive layer;

forming a gate insulating film on the insulating film to cover the columnar conductive layer and the drain electrode; and forming a gate electrode on the gate insulating film covering the columnar conductive layer, wherein forming the gate electrode comprises, forming an undoped polysilicon layer on the gate insulating film to cover the columnar conductive layer and the drain electrode, and etching back the undoped polysilicon layer so that the undoped polysilicon layer surrounds the columnar conductive layer and the drain electrode.

2. A method as claimed in claim 1, wherein the columnar conductive layer is formed of undoped polysilicon.

3. A method as claimed in claim 1, wherein the offset region is formed in a portion of the columnar conductive layer corresponding to a distance between the source electrode and the gate electrode.

4. A method as claimed in claim 1, wherein a channel region is formed in a portion of the columnar conductive layer corresponding to a height of the gate electrode.

5. A method as claimed in claim 4, wherein a width of the channel region is proportional to a circumference of the columnar conductive layer.

6. The method of claim 1, wherein the step of forming a source electrode on a substrate comprises:

forming a doped polysilicon layer on the substrate; and patterning the doped polysilicon layer to form a source electrode.

7. The method of claim 1, wherein the steps of forming a columnar conductive layer and an insulating film comprise:

forming said insulating film over the substrate and the source electrode;

forming a trench in the insulating film to expose the source electrode;

filling the trench with a conductive material to form the columnar conductive layer; and partially etching back the insulating film so that an upper portion of the columnar conductive layer is exposed and so that the source electrode remains covered by a non-etched portion of the insulating film.

8. A method of forming a thin film transistor, comprising:

forming a source electrode on a substrate;

forming an insulating layer over the substrate and the source electrode;

forming a trench in the insulating layer to expose a top surface of the source electrode;

filling the trench with a semiconductor material;

etching back a portion of the insulating layer to expose an upper portion of the semiconductor material while leaving the source electrode covered by the insulating layer;

forming a gate insulating layer over the insulating layer and the exposed portion of the semiconductor material;

forming a drain in a top surface portion of the semiconductor material via ion implantation through the gate insulating layer; and forming a gate electrode that surrounds the upper portion of the source electrode.

9. The method of claim 8, wherein the steps of forming a drain and forming a gate comprise:

forming a polysilicon layer over the gate insulating layer;

etching back the polysilicon layer so that portions of the polysilicon layer surrounding the upper portion of the semiconductor material remain, and so that a portion of the gate insulating layer over the top surface of the semiconductor material is exposed; and injecting impurity ions into the top surface portion of the semiconductor material to form a drain, and into the remaining portions of the polysilicon layer to form a gate electrode.

10. The method of claim 8, wherein the step of forming a source electrode comprises:

forming a doped polysilicon layer on the substrate; and patterning the doped polysilicon layer to form the source electrode.

11. A method of forming a thin film transistor, comprising:

forming a source electrode on a substrate;

forming a columnar conductive layer on a top surface of the source electrode;

forming an insulating layer over the substrate such that the insulating layer covers the source electrode and such that the insulating layer leaves an upper portion of the columnar conductive layer exposed;

forming a drain in a top surface portion of the columnar conductive layer;

forming a gate insulating layer over the exposed portion of the columnar conductive layer and the insulating layer; and forming a gate electrode that surrounds the upper portion of the columnar conductive layer, and the upper portion of the gate insulating layer.

12. The method of claim 11, wherein the step of forming a source electrode comprises:

forming a doped polysilicon layer on the substrate; and patterning the doped polysilicon layer to form the source electrode.

13. The method of claim 11, wherein the steps of forming a columnar conductive layer and an insulating film comprise:

forming an insulating film on the substrate and the source electrode;

forming a trench in the insulating film to expose the source electrode;

filling the trench with a conductive material to form the columnar conductive layer; and partially etching back the insulating film so that the upper portion of the columnar conductive layer is exposed and so that the source electrode remains covered by a non-etched portion of the insulating film.

14. The method of claim 11, wherein the steps of forming a drain and forming a gate comprise:

forming a polysilicon layer over the gate insulating layer; and injecting impurity ions into the top surface portion of the columnar conductive layer to form a drain, and into the remaining portions of the polysilicon layer to form a gate electrode.

15. A method for fabricating a thin film transistor, comprising:

forming a source electrode on a substrate;

forming an insulating film over substrate and the source electrode;

forming a trench in the insulating film to expose the source electrode;

filling the trench with a conductive material to form a columnar conductive layer connected to the source electrode;

partially etching back the insulating film so that an upper portion of the columnar conductive layer is exposed and so that the source electrode remains covered by a non-etched portion of the insulating film, wherein a thickness of the insulating film above the source electrode is adjusted for fixing a height of an offset region;

injecting ions to form a drain electrode in an upper part of the columnar conductive layer;

forming a gate insulating film on the insulating film to cover the columnar conductive layer and the drain electrode; and, forming a gate electrode on the gate insulating film covering the columnar conductive layer.

* * * * *